(12) United States Patent
Walker et al.

(10) Patent No.: US 7,135,881 B2
(45) Date of Patent: Nov. 14, 2006

(54) METHOD AND SYSTEM FOR PRODUCING SIGNALS TO TEST SEMICONDUCTOR DEVICES

(75) Inventors: Ernest Walker, Weston, MA (US); Ronald A. Sartschev, Dunstable, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 11/018,626

(22) Filed: Dec. 21, 2004

(65) Prior Publication Data

US 2006/0132166 A1 Jun. 22, 2006

(51) Int. Cl.
*G01R 31/26* (2006.01)

(52) U.S. Cl. .................. 324/765; 324/73.1; 324/158.1

(58) Field of Classification Search .............. None
See application file for complete search history.

(56) References Cited

U.S. PATENT DOCUMENTS

| | | | |
|---|---|---|---|
| 4,998,026 A | 3/1991 | King | |
| 5,101,153 A | 3/1992 | Morong, III | |
| 5,200,696 A * | 4/1993 | Menis et al. | 324/158.1 |
| 5,514,976 A * | 5/1996 | Ohmura | 324/765 |
| 5,521,493 A * | 5/1996 | Persons | 324/158.1 |
| 5,617,035 A | 4/1997 | Swapp | |
| 5,754,041 A | 5/1998 | Kaito et al. | |
| 6,498,473 B1 * | 12/2002 | Yamabe | 324/158.1 |
| 6,677,775 B1 * | 1/2004 | Babcock | 324/765 |
| 6,687,868 B1 | 2/2004 | Furukawa et al. | |
| 6,828,775 B1 | 12/2004 | Chow et al. | |
| 6,836,136 B1 * | 12/2004 | Aghaeepour | 324/765 |
| 6,859,902 B1 | 2/2005 | Dalal et al. | |
| 6,879,175 B1 * | 4/2005 | Conner | 324/765 |
| 6,885,213 B1 | 4/2005 | Sunter | |
| 2005/0189950 A1 * | 9/2005 | Lu | 324/606 |

OTHER PUBLICATIONS

Mercury, System on a Chip, 50 MHz Octal Pin Electronics with PMU; Planet ATE; Nov. 22, 2004.
Neptune, SOC Pin Electronics Companion PMU/DAC/Resistive Load; Planet ATE; Jun. 16, 2004.
Pluto, Octal PMU/VI with Ganging 5 MHz Pin Electronics; Planet ATE; Oct. 28, 2004.
Saturn, System on a Chip, Dual Channel Wide Voltage Pin Electronics Solution; Planet ATE; Jul. 19, 2005.
Venus, System on a Chip, Dual Channel 133 MHz Pin Electronics Solution; Planet ATE; Sep. 16, 2004.
International Search Report and Written Opinion Dated Aug. 25, 2006 for International Application No. PCT/US2005/45606.

* cited by examiner

*Primary Examiner*—Minh N. Tang
(74) *Attorney, Agent, or Firm*—Fish & Richardson P.C.

(57) ABSTRACT

A method of and system for producing signals to test semiconductor devices includes a pin electronic (PE) stage for providing a parametric measurement unit (PMU) current test signal to a semiconductor device under test. The PE stage also senses a response from the semiconductor device under test.

19 Claims, 8 Drawing Sheets

METHOD AND SYSTEM FOR PRODUCING SIGNALS TO TEST SEMICONDUCTOR DEVICES

TECHNICAL FIELD

This disclosure relates to testing semiconductor devices and, more particularly, to producing current signals for testing semiconductor devices.

BACKGROUND

As the commercial demand for semiconductor devices (e.g., memory chips and microprocessors) increases, testing of these devices has become critical for device manufacturers. By testing semiconductor devices prior to shipping to their customers, defective or under-performing devices may be detected and removed. To perform such tests, semiconductor device testers such as automatic test equipment (ATE) may be used to characterize and validate the performance of manufactured semiconductor devices.

For some types of tests, the ATE may send two types of signals to a device-under-test (DUT). Direct current (DC) signals are sent to the DUT for measuring device characteristics such as input and output impedance, leakage current, and DUT performance. To produce and send these DC signals, the ATE includes a parametric measurement unit (PMU). The ATE also generates and sends alternating current (AC) signals to the DUT, which for some test scenarios simulate digital signals. These simulated digital signals, for example, may be input into a memory chip under test. After storing the digital values represented by the digital signals, the values are retrieved (at a later time) to determine if the DUT has properly stored the values. To generate and send the AC test signals, the ATE includes additional circuitry known as Pin Electronics (PE) circuitry that typically operates at higher speeds compared to the PMU circuitry. Due to the slower PMU circuitry, PMU tests typically use more test time than PE tests.

SUMMARY OF THE DISCLOSURE

In accordance with an aspect of the disclosure, a semiconductor device tester includes a pin electronic (PE) stage that provides a parametric measurement unit (PMU) current test signal to a semiconductor device under test, the PE stage also senses a response from the semiconductor device under test.

In one embodiment, the sensed response may be a voltage that is present at the semiconductor device under test. The PMU current test signal may be a DC current signal. The PE stage may includes one or more current sources. The PE stage may include a comparator stage for analyzing the sensed response.

In accordance with another aspect, a semiconductor tester includes, a pin electronic (PE) current signal generator that provides a parametric measurement unit (PMU) current test signal to a semiconductor device under test.

In another embodiment, the PMU current test signal may be a DC current signal. The PE current signal generator may also include a diode for producing the PMU current test signal. Furthermore, the PE current signal generator may include one or more current sources.

In accordance with another aspect, a semiconductor tester includes a pin electronics (PE) comparator stage that receives a signal from a semiconductor device under test in response to a parametric measurement unit (PMU) current test signal.

In another embodiment, the received signal may be a voltage signal. The PE comparator stage may include an operational amplifier that compares the received signal to a voltage. The PE comparator stage may also provide a signal that represents the comparison of the received signal and the voltage.

In accordance with another aspect, a method of testing a semiconductor device includes providing a parametric measurement unit (PMU) current test signal from a pin electronic (PE) stage to the semiconductor device, and sensing with the PE stage a response to the PMU current test signal from the semiconductor device.

In another embodiment, sensing the response to the PMU current test signal may include sensing a voltage at the semiconductor device. The method may further include comparing the voltage to a predefined voltage. The method may also further include comparing the voltage to a two voltage, in which one voltage is less than the other voltage. The method may also include producing a signal that represents the comparison of the sensed voltage and the predefined voltage.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

DETAILED DESCRIPTION OF THE EMBODIMENTS

Figure 1:
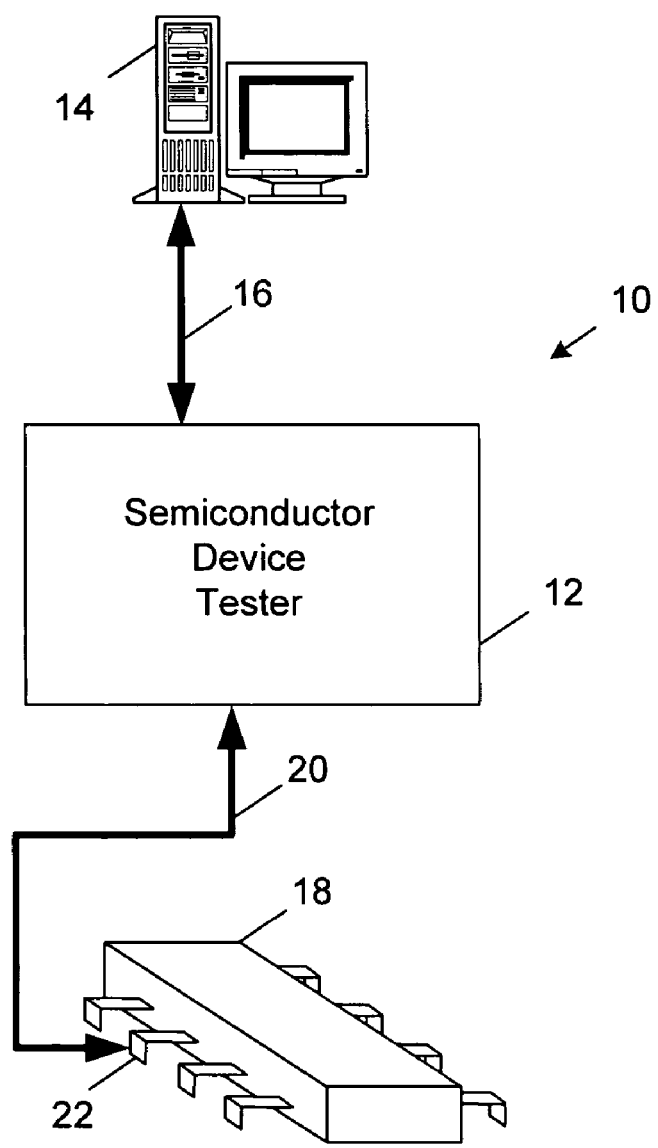
FIG. 1 is a diagrammatic view of a system for testing semiconductor devices.

Referring to FIG. 1, a system 10 for testing semiconductor devices includes a semiconductor device tester 12 such as ATE or other similar testing device. To control semiconductor device tester 12, system 10 includes a computer system 14 that interfaces with tester 12 over a hardwire connection 16. Typically, computer system 14 sends commands to tester 12 that initiate the execution of routines and functions for testing a semiconductor device. Such executing test routines may initiate the generation and transmission of test signals to the semiconductor device-under-test (DUT) and collecting responses from the DUT. Various types of semiconductor devices may be tested by system 10. In this example, an integrated circuit (IC) chip 18 (e.g., memory chip, microprocessor, analog-to-digital converter, digital-to-analog converter, etc.) is tested as a DUT.

To provide test signals and collect responses from the DUT, semiconductor device tester 12 is connected to one or more connector pins that provide an interface for the internal circuitry of IC chip 18. To test some DUTs, e.g., as many as sixty-four or one hundred twenty-eight connector pins (or more) may be interfaced to tester 12. For illustrative purposes, in this example semiconductor device tester 12 is connected to one connector pin of IC chip 18 by a hardwire connection. A conductor 20 (e.g., cable) is connected to pin 22 and is used to deliver test signals (e.g., PMU test signals, PE test signals, etc.) to the internal circuitry of IC chip 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in IC chip 18. For example, tester 12 may provide test signals into other pins and collect associated signals reflected back over conductors (that deliver the provided signals). By collecting the reflected signals, the input impedance of the pins may be characterized along with other single port testing quantities. In other test scenarios a digital signal may be sent over conductor 20 to pin 22 for storing a digital value on IC chip 18. Once stored, IC chip 18 may be accessed to retrieve and send the stored digital value over conductor 20 to tester 12. The retrieved digital value may then be identified to determine if the proper value was stored on IC chip 18.

Along with performing one-port measurements, a two-port test may also be performed by semiconductor device tester 12. For example, a test signal may be injected over conductor 20 into pin 22 and a response signal may be collected from one or more other pins of IC chip 18. This response signal is provided to semiconductor device tester 12 to determine such quantities as gain response, phase response, and other throughput measurement quantities.

Figure 2:
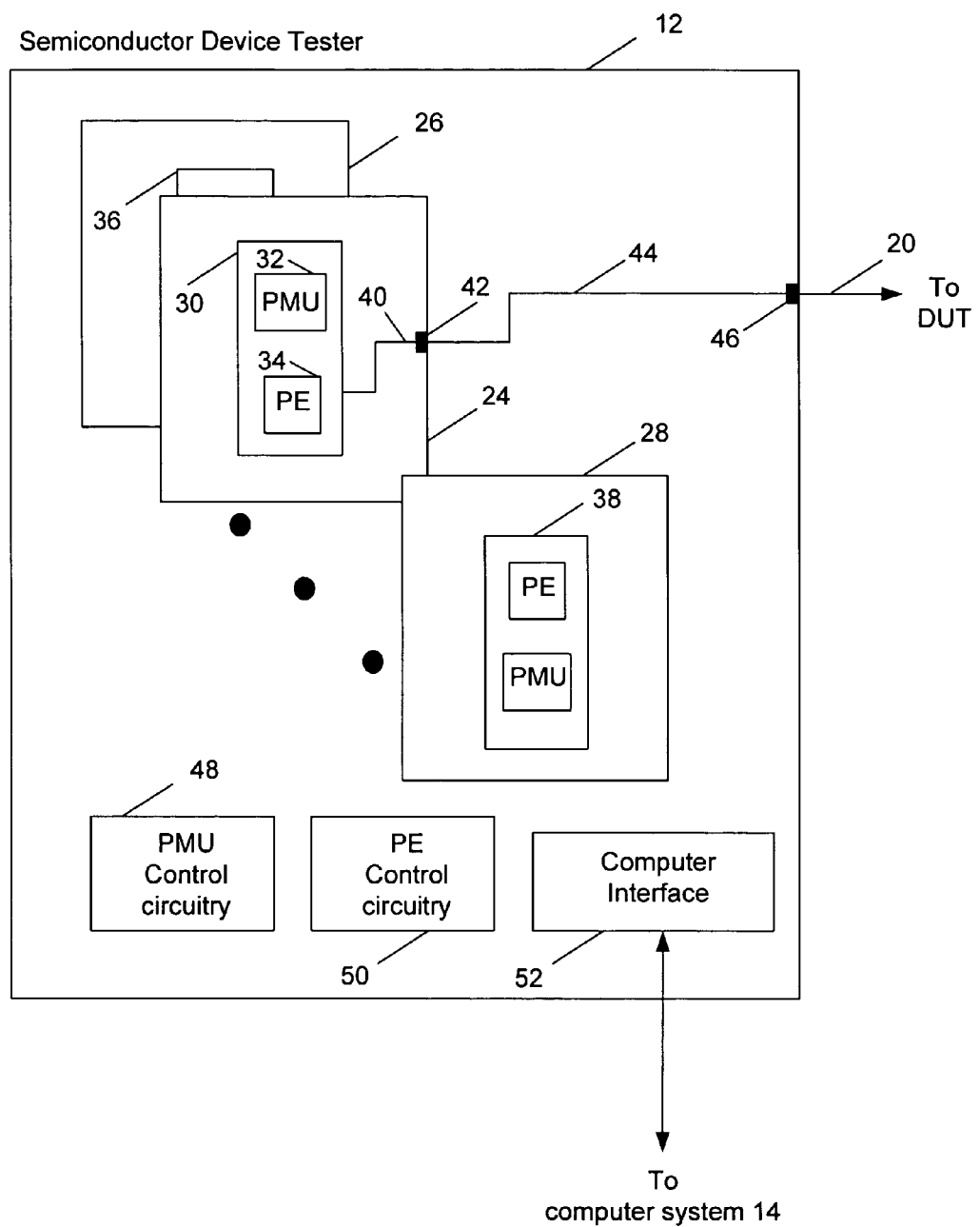
FIG. 2 is a diagrammatic view of a semiconductor device tester included in the system shown in FIG. 1.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect the corresponding responses. Each communication link to a pin is typically referred to as a channel and by providing test signals to a large number of channels, testing time is reduced since multiple tests may be simultaneously performed. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and Pin electronics (PE) tests. IC chip 30 respectively has a PMU stage 32 that includes circuitry for performing PMU tests and a PE stage 34 that includes circuitry for performing PE tests. Additionally interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., IC chip 18) and collecting responses to further characterize the performance of the DUT. For example, IC chip 30 may transmit (to the DUT) AC test signals that represent a vector of binary values for storing on the DUT. Once stored, the DUT is accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals and waveforms from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46 that allows signals to be passed to and from tester 12. In this example conductor 20 is connected to interface connector 46 for bi-directional signal passing between tester 12 and pin 22 of IC chip 18. In some arrangements an interface device may be used to connect one or more conductors from tester 12 to the DUT. For example, the DUT (e.g., IC chip 18) may be mounted onto a device interface board (DIB) for providing easy access to each DUT pin. In such an arrangement, conductor 20 may be connected to the DIB for placing test signals on the appropriate pin(s) (e.g., pin 22) of the DUT.

In this example only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. Tester 12 also includes a computer interface 52 that allows computer system 14 to control the operations executed by tester 12 and also allows data (e.g., test parameters, DUT responses, etc.) passing between tester 12 and computer system 14.

As mentioned, PMU testing typically involves sending DC test signals to the DUT and collecting response signals. For example, test signals may be sent to provide a particular DC current or DC voltage to the DUT. Typically, when these test signals are produced with circuitry in PMU stage 32, the desired current and voltage levels are not instantaneously achieved and time is needed for these signals to settle at their predefined levels. Due to this signal settling period, additional time is needed to perform a PMU test. Multiplying this delay time by the number of PMU tests being performed on a DUT (or a group of DUTs), significant testing time is lost. This lost testing time correspondingly reduces manufacturing efficiency and increases manufacturing costs.

Figure 3:
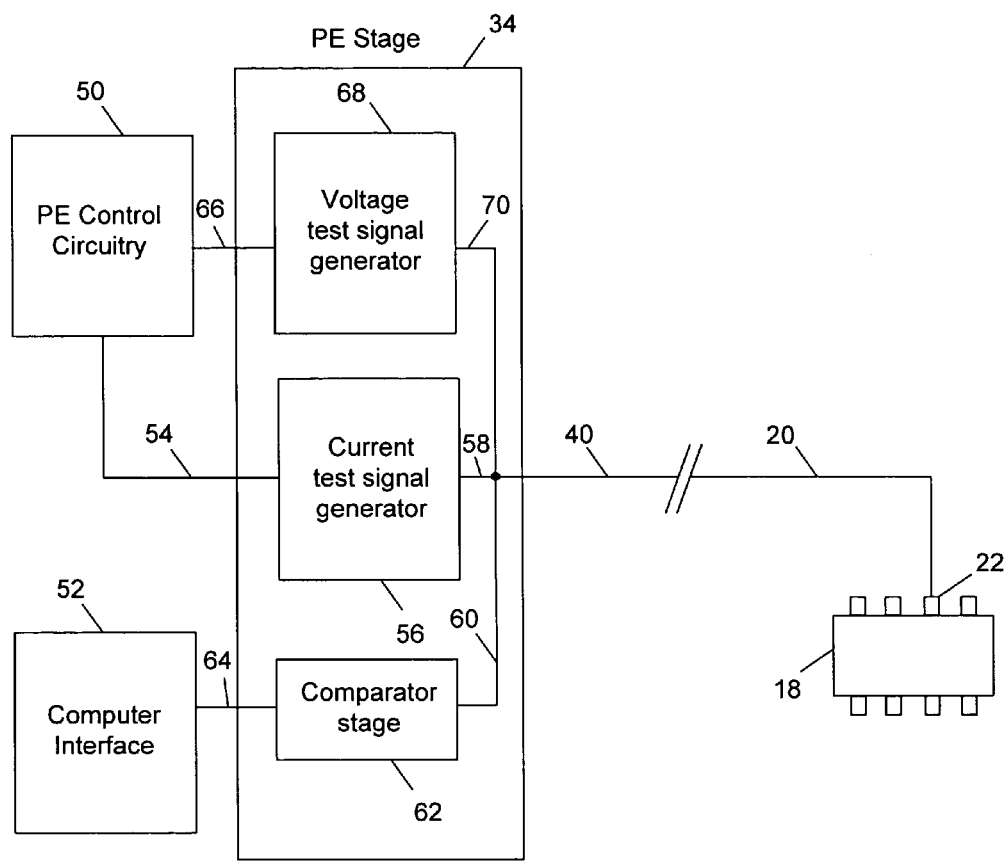
FIG. 3 is a diagrammatic view of PE stage configured to provide PMU test signals from the tester shown in FIG. 2.

Referring also to FIG. 3, to reduce PMU testing time, the relatively high-speed PE stage 34 is used to perform some PMU tests by producing PMU test signals. By producing PMU test signals with PE stage 34, signal settling time decreases along with testing time. Additionally, PE stage 34 is used to collect response signals from the DUT(s) being provided the PMU test signals. In particular, PE stage 34 is used to produce PMU test signals that provide a particular current signal to the DUT. Along with providing the PMU test signal, PE stage 34 also senses a voltage at the DUT that is produced in response to the current test signal. By using the high-speed circuitry of PE stage 34 (compared to PMU stage 32), PMU test signals are produced relatively quickly and testing time is reduced. By reducing testing time, time is conserved and may be used for testing additional DUTs and thereby improve manufacturing efficiency.

To initiate a PMU test with PE stage 34, PE control circuitry 50 sends a control signal over conductor 54 to a current test signal generator 56 that is included in PE stage 34. Typically current test signal generator 56 uses the control signal for setting the current level of an output signal that is sent to the DUT. For example, the control signal may direct current test signal generator 56 to output a fifty milliamp DC current signal over conductor 58 for delivery to pin 22 of IC chip 18 (via conducting trace 40 and conductors 44 and 20).

Along with sending DC test current signals, PE stage 34 also collects response signals from the DUT after injecting the PMU test signal. For example, after providing a DC current test signal, a voltage signal may be sensed at pin 22 and sent to PE stage 34 over the same conductors (i.e., conductors 20 and 44, and conducting trace 40) that provided the current signal to the DUT. Upon receiving the voltage signal, a conductor 60 provides the signal to a comparator stage 62 included in PE stage 34. By comparing the voltage signals to predefined voltages, comparator stage 62 is capable of determining the DC voltage level of the response signal sensed at the DUT. Upon determining the level of the DC voltage signal sensed at the DUT, comparator stage 62 passes representative data over a conductor 64 to computer interface 52 that passes the data to a computer system (e.g., computer system 14) or another type of digital device (e.g., a personal digital assistant (PDA), a cellular telephone, etc.) or a network (e.g., the Internet).

While PE stage 34 provides PMU test signals for reducing PMU testing times, the stage also provides PE testing functions. For example, PE control circuitry 50 may send a control signal over a conductor 66 to a voltage test signal generator 68 that is included in PE stage 34. Voltage test signal generator 68 produces PE test signals such as AC waveforms that are sent over a conductor 70 (along with conducting trace 40 and conductors 44 and 20) to the DUT. Similar to providing PMU test signals, the DUT may produce signals in response to the PE test signals. Some of these response signals may be received by PE stage 34 via conductors 20, 44, and conducting trace 40. Upon receiving the signals, they may be sent over conductor 60 to comparator stage 62 for analysis. For example, an AC signal may be received by PE stage 34 in response to an AC signal sent from voltage test signal generator 68. Arriving at comparator stage 62, this AC response signal may be compared to a predefined voltage level determine if the signal is above or below the voltage. Once determined, data representing the comparison may be sent over conductor 64 to computer interface 52 for further analysis by a computer system such as computer system 14.

Figure 4:
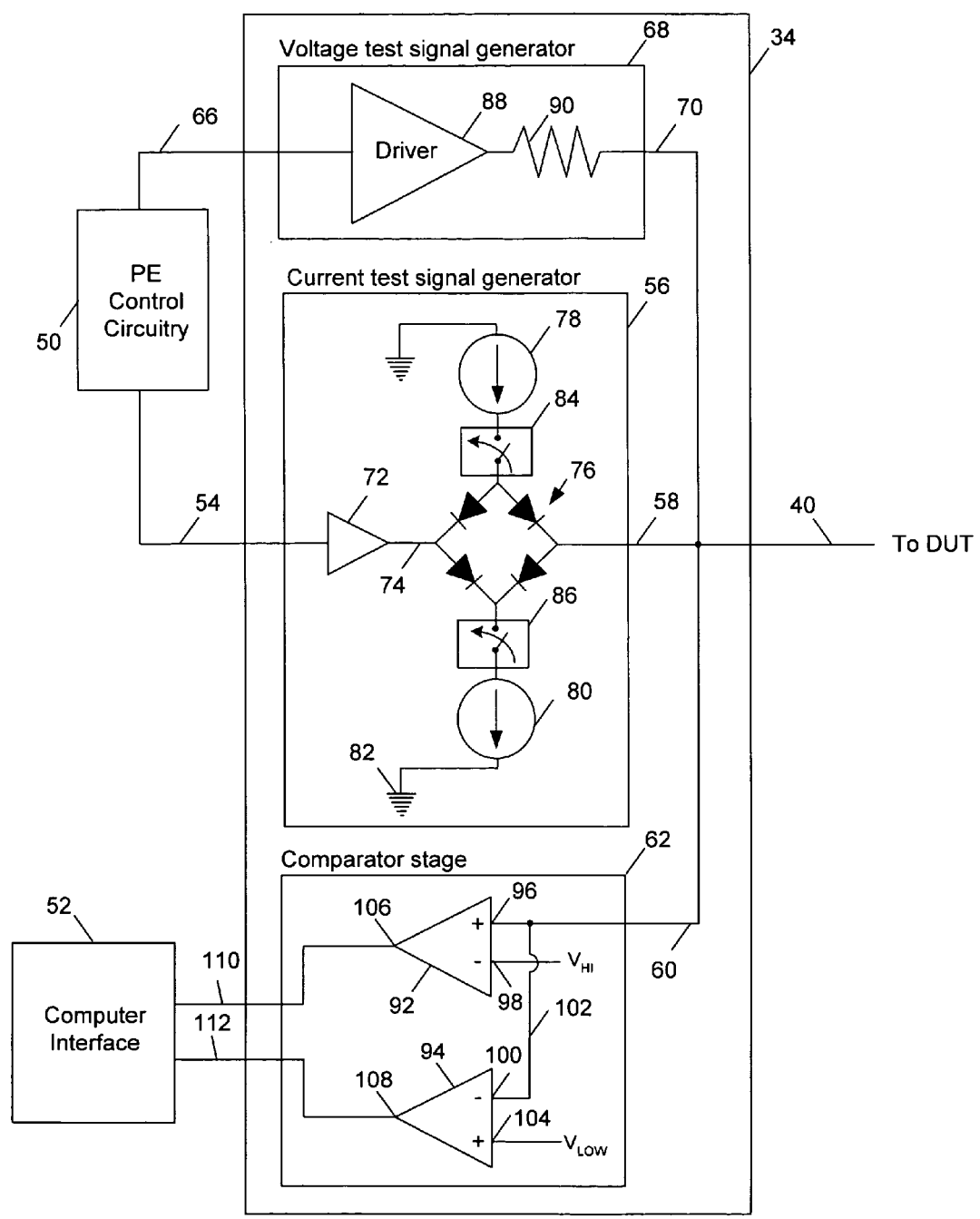
FIG. 4 is an exemplary circuit diagram of the PE stage shown in FIG. 3.

Referring also to FIG. 4, exemplary circuitry for PE stage 34 is presented that includes voltage test signal generator 68, current test signal generator 56, and comparator stage 62. Along with providing PE test signals to a DUT, PE stage 34 provides PMU test signals to reduce PMU testing time. In particular, current test signal generator 56 is used to produce PMU current test signals that are sent to the DUT (e.g., IC chip 18) over conductor 58 and conducting trace 40. In response to receiving a DC current test signal, a voltage response signal is produced by the DUT. For example, by forcing a current test signal into pin 22, a voltage signal may be produced at pin 22 due to the input impedance of the DUT. This voltage signal at pin 22 is provided to PE stage 34 via conductors 20, 44, and conducting trace 40. When a signal is provided by the DUT, current test signal generator 56 and voltage test signal generator 68 are placed in a high output impedance mode. Due to the high output impedance mode, the voltage signal is provided over conductor 60 to comparator stage 62 and is not received by current test signal generator 56 and voltage test signal generator 68. Comparator stage 62 determines the level of the voltage signal from the DUT and provides a signal to computer interface 52 that identifies this voltage level. As mentioned, the circuitry used for PE testing operates at relatively high speeds to provide e.g., digital test signals to the DUT and to collect corresponding response signals from the DUT. By using this high speed circuitry of PE stage 34 for PMU testing, PMU tests are executed faster and testing time is conserved additional operations such as more PMU and PE tests.

To provide current test signals, PE control circuitry 50 sends a signal over conductor 54 to current test signal generator 56. In this example, conductor 54 provides the signal from PE control circuitry to an amplifier 72 that conditions (e.g., amplifies) the signal and sends it over a conductor 74 to a diode bridge 76. The signal received by diode bridge 76 is used to bias the diodes included in the bridge and control the current signal provided by generator 56. By biasing diode bridge 76, current may flow from a current source 78 to conductor 58 or current may flow from conductor 58 to a second current source 80 that is connected to a ground terminal 82. Since generator 56 provides bi-directional current flows by using current source 78 and current source 80, PE control circuitry 50 can modulate the current signal sent to the DUT by controlling the bias of diode bridge 76. By providing modulated current signals, tester 12 may provide a variety of AC signals to the DUT for PE testing. Current test signal generator 56 also includes two switches 84 and 86 that respectively control current flow from current source 78 or to current source 80. For example, if switch 84 is closed, current source 78 is connected to diode bridge 76 and may send a current signal to the DUT via conductor 58. Similarly, if switch 86 is closed, current source 80 is connected to diode bridge 76 and may draw current through conductor 58. If switch 84 or 86 is open, the corresponding current source 78 or 80 is isolated from diode bridge 76.

To provide a voltage test signal to the DUT for PE tests, PE control circuitry 50 sends a test signal (e.g., AC signal, digital signal, etc.) to voltage test signal generator 68 over conductor 66. Conductor 66 provides the signal to a driver (e.g., amplifier circuit) that conditions (e.g., amplifies) the signal and sends a voltage test signal to a resistor 90. The resistance of resistor 90 is selected for impedance matching. To deliver the voltage test signal to the DUT, resistor 90 is connected to conductor 70 that connects to conducting trace 40.

To provide a DC current signals for PMU testing, in one scenario, PE control circuitry 50 provides a signal to amplifier 72 for biasing diode bridge 76. The signal from amplifier 72 biases diode bridge 76 such that current passes through the bridge substantially un-modulated (to produce a DC current signal). In one example, switch 84 is closed and current source 78 provides current to diode bridge 76. Since the current is not modulated, a substantially DC current signal is sent over conductor 58 to conducting trace 40 for delivery to the DUT (e.g., IC chip 18). In other test scenarios, current source 80, or a combination of current sources 78 and 80 may provide a DC current test signal to the DUT.

Upon receiving the DC current test signal from signal generator 56, a voltage signal is produced at the DUT (e.g., pin 22 of IC chip 18). This voltage signal is provided from the DUT to conducting trace 40 (via conductors 20 and 44). Since the output impedance of the voltage test signal generator 68 and the current test signal generator 56 is relatively large, these stages are isolated and the voltage signal is provided to comparator stage 62 for analysis. For one analysis, the voltage signal is compared to one voltage level (i.e., $V_{HI}$) and a lower voltage level (i.e., $V_{LOW}$). By performing the comparison, comparator stage 62 may determine if the voltage signal on conductor 60 is greater than $V_{HI}$, less than $V_{LOW}$, or is between $V_{HI}$ and $V_{LOW}$. By assigning voltages to $V_{HI}$ and $V_{LOW}$ that are slightly different, the value of the voltage signal may be approximately determined. For example, $V_{LOW}$ may be set to 0.65 volt and $V_{HI}$ may be set to 0.75 volt. If comparator stage 62 determines that the voltage signal from the DUT is between $V_{HI}$ and $V_{LOW}$, a voltage level of 0.7 volt may be used to approximately characterize the voltage signal. If comparator stage 62 determines that the voltage signal is less than $V_{LOW}$ or greater than $V_{HI}$, new voltages may be assigned to $V_{LOW}$ and $V_{HI}$. For example, $V_{LOW}$ and $V_{HI}$ may be increased or decreased by the same amount to retain the detection window width. Alternatively $V_{LOW}$ and $V_{HI}$ may adjusted to widen or narrow the detection window. These adjusted voltages for $V_{LOW}$ and $V_{HI}$ may then be compared to voltage signal to approximate the voltage level of the signal. In some arrangements, adjustments to $V_{LOW}$ and $V_{HI}$ and comparing the voltages is executed in an iterative fashion to approximate the voltage signal from the DUT.

In this example, comparator stage 62 includes two operational amplifiers 92, 94 for approximating the voltage of the voltage signal on conductor 60 from the DUT. Operational amplifier 92 is provided the voltage signal on a non-inverting input 96 and $V_{HI}$ on an inverting input 98. Similarly operational amplifier 94 is provided the voltage signal on an inverting input 100 (over a conductor 102) and $V_{LOW}$ on a non-inverting input 104. Operational amplifier 92 provides a signal at an output 106 that identifies if the voltage signal is greater than or less than $V_{HI}$. Similarly operational amplifier 94 provides a signal at an output 108 that identifies if the voltage signal is greater than or less than $V_{LOW}$. In this example, both of these signals are sent to computer interface 52 over respective conductors 110 and 112. By providing these signals to computer interface 52, data representing the comparison performed by comparator stage 62 may be provided to other portions of tester 12 and computer system 14. Based on this data, the voltage signal from the DUT may be approximated if the voltage is between $V_{LOW}$ and $V_{HI}$. If the signal voltage is greater than $V_{HI}$ or less than $V_{LOW}$, computer system 14 or tester 12 may initiate adjustments to $V_{LOW}$ and/or $V_{HI}$ and execute another comparison of the voltage signal. However, since PE stage 34 operates at higher speeds compared to a PMU stage, by performing PMU testing with PE stage 34 testing efficiency increases and testing time is reduced.

Figure 5:
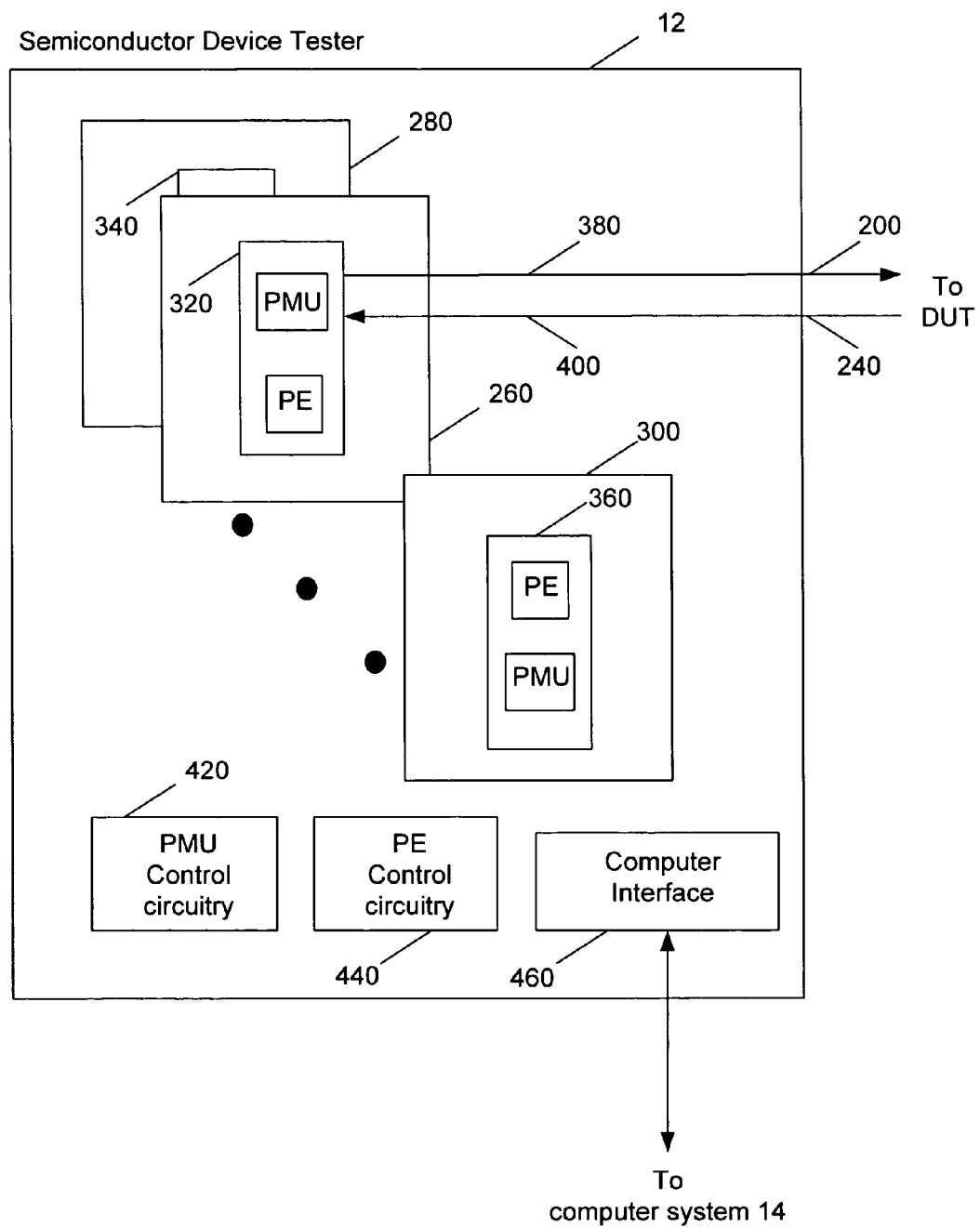
FIG. 5 is a diagrammatic view of another embodiment of the semiconductor device tester included in the system shown in FIG. 1.

Referring to FIG. 5 in some embodiments, semiconductor device tester 12 includes an interface card 260 that is capable of communicating with numerous pins of a DUT (or multiple DUTs). For example, interface card 260 may initiate transmitting test signals to, e.g., thirty-two, sixty-four, or one hundred twenty-eight pins and collecting the corresponding responses. Each communication link to a pin is typically referred to as a channel and by providing a large number of channels, testing time is reduced. Along with having many channels on an interface card, by including multiple interface cards in tester 12, the overall number of channels increases thereby further reducing testing time. In this example, two additional interface cards 280 and 300 are shown to demonstrate that multiple interface cards may populate tester 12.

Each interface card includes a dedicated integrated circuit (IC) chip (e.g., an application specific integrated circuit (ASIC)) for performing particular test functions. For example, interface card 260 includes IC chip 320 for performing PMU and PE tests. Additionally interface cards 280 and 300 respectively include IC chips 340 and 360 that provide PMU and PE testing. Typically PMU testing involves providing a DC voltage or current signal to the DUT to determine such quantities as input and output impedance, current leakage, and other types of DC performance characterizations. PE testing involves sending AC test signals and waveforms to a DUT (e.g., IC chip 18) and collecting responses to further characterize the performance of the DUT. For example, IC chip 320 may initiate transmitting (to the DUT) AC test signals that represent a vector of binary values for storing on the DUT. Once stored, the DUT is accessed by tester 12 to determine if the correct binary values have been stored. Since digital signals typically include abrupt voltage transitions, the PE circuitry on IC chip 320 operates at a relatively high speed in comparison to the PMU circuitry on IC chip 320.

To pass both DC and AC test signals and waveforms from interface card 260 to DUT 18, a pair of conducting traces 380, 400 connect IC chip 320 to respective conductors 200 and 240. In some arrangements an interface device may be used to connect conductors 200 and 240 to the DUT. For example, the DUT (e.g., IC chip 18) may be mounted onto a device interface board (DIB) such that each DUT pin is easily accessible. In such an arrangement, conductors 200 and 240 may respectively connect to the DIB for placing test signals on the appropriate pin(s) of the DUT.

In this example only two conductors 380, 400 respectively connect IC chip 320 to conductors 200 and 240 for delivering and collecting signals. However, IC chip 320 (along with IC chips 340 and 360) typically has multiple pins (e.g., eight, sixteen, etc.) that are respectively connected with multiple conductors to the DIB. Additionally, in some arrangements, tester 12 may connect to two or more DIB's in order to interface the channels provided by interface cards 260, 280, and 300 to one or multiple devices under test.

To initiate and control the testing performed by interface cards 260, 280, and 300, tester 12 includes PMU control circuitry 420 and PE control circuitry 440 that provide test parameters (e.g., test signal voltage level, test signal current level, digital values, etc.) for producing test signals and analyzing DUT responses. Tester 12 also includes a computer interface 460 that allows computer system 14 to control the operations executed by tester 12 and also allows data (e.g., test parameters, DUT responses, etc.) passing between tester 12 and computer system 14.

Figure 6:
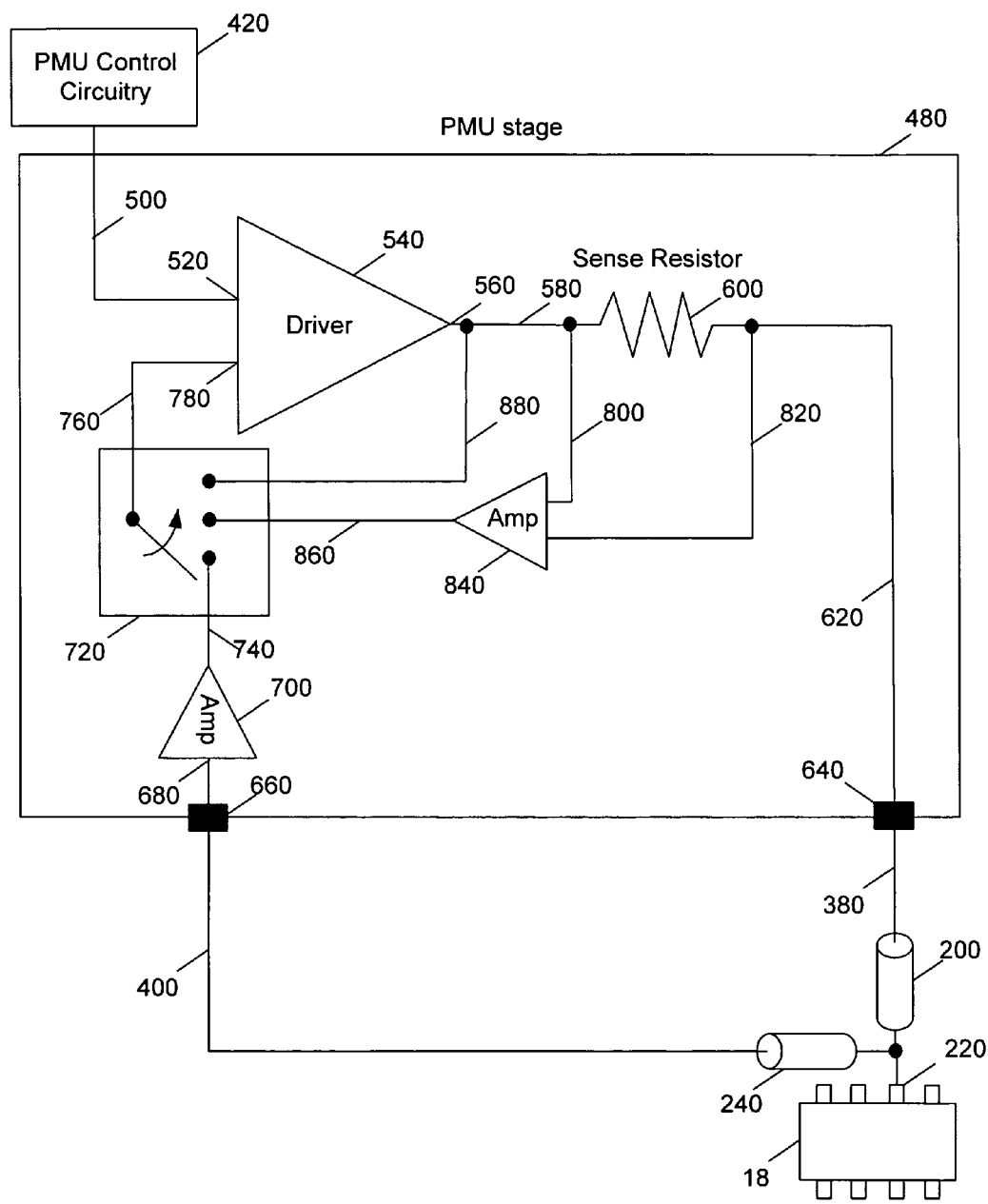
FIG. 6 is a diagrammatic view of PMU stage that includes a feedback circuit for reducing PMU testing time.

Referring to FIG. 6, a portion of IC chip 320 is shown that includes a PMU stage 480 for performing PMU testing. To initiate sending a PMU test signal to DUT 18, PMU control circuitry 420 sends a DC signal over conducting trace 500 to an input 520 of a driver circuit 540 that conditions (e.g., amplifies) the signal and sends it to an output 560. For example, PMU control circuitry 420 may provide a 3-volt DC signal to input 520. Using this input signal, driver circuit 540 may apply a unity gain and provide a 3-volt DC signal at the high-impedance output 560. To send the 3-volt DC signal to IC chip 18 for PMU testing, a conductor 580 is connected to output 560. Conductor 580 is connected to a sense resistor 600 that is used to monitor PMU test signals sent to the DUT. Sense resistor 600 is also connected to a conductor 620 that provides the 3-volt DC test signal to an interface connector 640 that allows the test signal to exit IC chip 320. In this example, interface connector 640 is connected to conductor 380 that provides the PMU test signal to pin 220 of IC chip 18 via conductor 200.

In this example, a 3-volt DC signal is provided by semiconductor device tester 12 to pin 220 for performing PMU testing. However, if IC chip 18 draws current from this signal, voltage drops are produced by impedances that are present between driver circuit 540 and IC chip 18. For example, if current flows into pin 220, a voltage drop is produced across sense resistor 600. Additionally, resistance present in interface connector 620 and/or conductors 620, 380, and 200 may produce voltage drops due to this current flow. Due to these voltage drops, the level of the 3-volt DC signal at pin 220 reduces compared to the test signal provided by PMU control circuitry 420 to input 520 of driver circuit 540. For example, due to current drawn by IC chip 18, the DC signal at pin 220 may be substantially less (e.g., 1-volt) than the 3-volt DC signal present at input 520 of driver circuit 540.

To compensate for voltage drops experienced between driver circuit 540 and IC chip 18 (or another DUT), semiconductor device tester 12 includes circuitry for detecting signal loss and for appropriately adjusting the output of driver circuit 540. For example, if the test signal at pin 220 has reduced to a 2-volt signal, tester 12 detects this 1-volt signal loss and adjusts the output of driver circuit 540 so that the desired 3-volt signal is delivered to IC chip 18. To detect this signal loss at the DUT, one conventional technique monitors the test signal present at the DUT and adjusts the output of driver circuit 540 to compensate for the detected signal loss. In this example, to monitor the PMU test signal provided to IC chip 18, conductor 240 is connected to pin 220. By monitoring the test signal present at pin 220, a feedback signal may be sent to driver circuit 540 for adjusting its output. In particular, the feedback signal is passed from conductor 240 to conductor 400 that is connected to an interface connector 660. Interface connector 660 provides the feedback signal to the internal circuitry of IC chip 320. In this example, the feedback signal is passed to an input 680 of a buffer amplifier 700 (e.g., a unity gain amplifier) so that minimal current is drawn through conductors 240 and 400 and interface connector 660. While buffer amplifier 700 is incorporated into IC chip 320, in other arrangements buffer amplifier 700 may be located external to IC chip 320. For example, buffer amplifier 700 may be located on interface card 260 or near to the DUT.

Buffer amplifier 700 passes the feedback signal through a conductor 740 to a switch 720 that controls from which source feedback is provided to driver circuit 540. Typically tester 12 or computer system 14 controls which position switch 720 is placed. If switch 720 is placed into a position that connects conductor 740 and a conductor 760, the feedback signal from pin 22 is provided to an input 780 of the driver circuit 540. By providing this feedback signal, driver circuit 540 can determine the difference between the feedback signal and the test signal provided by PMU control circuitry 420 (at input 520). For example, if the feedback signal is a 2-volt DC signal and the signal from PMU control circuitry 420 is a 3-volt DC signal, driver circuit 540 compares the signals to determine that 1-volt is loss during transmission to pin 220. To compensate for this loss, driver circuit 540 may adjust its output so that a 4-volt DC signal is provided from output 560. Correspondingly, due to the losses between driver circuit 540 and the DUT, the 4-volt signal is reduced to a 3-volt DC signal at pin 220. So, by monitoring the signal present at pin 220 and appropriately adjusting the output of driver circuit 540, the desired test signal is provided to the DUT.

Another conventional technique to monitor the PMU test signal being provided to the DUT is to monitor the current being drawn by the DUT. By monitoring this current flow, the output of driver circuit 540 may be adjusted to compensate for voltage drops due to this drawn current. To provide this monitoring technique, a pair of conductors 800, 820 is connected across sense resistor 600 to detect the voltage across the resistor. Thereby, if pin 220 draws current through conductors 200, 380, and 620, voltage is detected across sense resistor 600. Conductors 800 and 820 provide this voltage drop present across sense resistor 60 to a buffer amplifier 84 that provides a DC signal representing the voltage drop across sense resistor 600. A conductor 860 passes the DC signal from the output of buffer amplifier 840 to switch 720. If switch 720 is closed (by tester 12 or computer system 14) to connect conductor 860 and conductor 760, the DC signal from buffer amplifier 840 is provided to input 780 of driver circuit 540. Similar to the DC signal that may be present on conductor 740 (from pin 220), the feedback signal present on conductor 860 is used by driver circuit 540 for adjusting its output to compensate for the current being drawn by the DUT.

By monitoring PMU test signals with a feedback signal that is detected at sense resistor 600 or the DUT (e.g., pin 220), driver circuit 540 can accurately adjust for signal losses between the driver circuit and the DUT. However, these both of these feedback signals are sent across considerable distances prior to being received by switch 720. For example, the DC voltage signal detected at pin 220 is sent over conductors 240, 400, and 740, along with being passed through interface connector 660 and buffer amplifier 700. To monitor the voltage across sense resistor 60, the feedback DC voltage signal is passed through conductors 800, 820, and 860, along with being passed through buffer amplifier 840. These transmission distances cause a time delay for adjusting the output of driver circuit 540 for an appropriate test signal. Correspondingly, due to this time delay, additional time is needed for performing a PMU test. Furthermore as more devices are tested, considerable testing time is lost.

To reduce the time for driver circuit 540 to provide an appropriate DC test signal, PMU stage 480 includes a feedback circuit to monitor signals at output 560 of driver circuit 540 and provides a feedback signal to switch 720. By monitoring the signals at output 560, the time needed to provide a feedback signal to driver circuit 540 is significantly reduced. By reducing the time to provide a feedback signal, driver circuit 540 relatively quickly adjusts its output for current drawn by the DUT. In this example, the feedback circuit is provided by a conductor 880 that is connected to output 560 of driver circuit 540 and to switch 720. When switch 720 is closed (thus connecting conductor 880 to conductor 760), the signal present at output 560 is provided to input 780 of driver circuit 540. Accordingly, if the DC test signal present at output 560 is reduced (e.g., a 2-volt DC signal) due to current drawn by IC chip 18, driver circuit 540 can relatively quickly adjust the output signal so that the desired test signal (e.g., a 3-volt DC signal) is received at pin 220.

In this example, conductor 880 provides a feedback signal from output 560 to switch 720, however in other arrangements other circuitry may be implemented to provide the feedback circuitry. For example, a buffer amplifier may be connected along conductor 88 to reduce current being drawn by the conductor. Also, conductor 880 may be directly connected from output 560 to input 780. By removing switch 720, propagation delays are further reduced. However, the inclusion of switch 720 and the circuitry for monitoring voltage signals across sense resistor 600 and/or at pin 220 allows for accurate feedback signals to be detected at (or near) the DUT. However, monitoring the PMU test signals at sense resistor 600 and pin 220 increases the time needed for driver circuit 540 to adjusts the driver circuit output along with increasing the overall PMU testing time.

Figure 7:
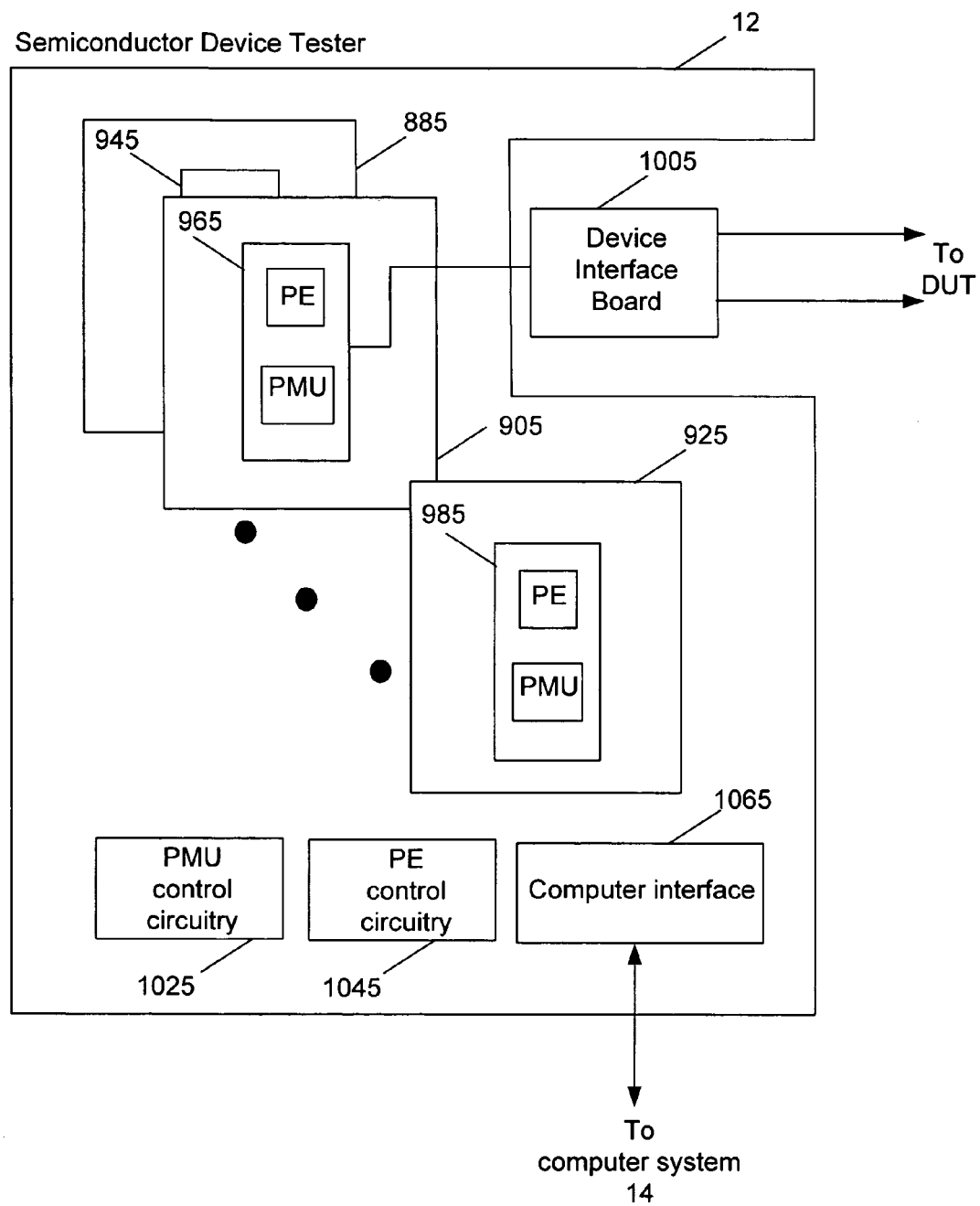
FIG. 7 is a diagrammatic view of a semiconductor device tester with PE and PMU circuitry incorporated into the same integrated circuit chips.

Referring to FIG. 7, to reduce the occupied space on each interface card and reduce output stage redundancy, PE circuitry and PMU circuitry are incorporated in the same IC chip. Additionally, both the PE circuitry and PMU circuitry share a common output stage to reduce circuitry in each IC chip providing both PE and PMU functions. For illustrative purposes, another embodiment of tester 12 includes a series of interface cards 885, 905, and 925 that respectively have mounted IC chips that provide PE and PMU functions for testing of a DUT (e.g., a memory chip, a microprocessor, an analog-to-digital converter, etc.). In particular, respective IC chips 945, 965, and 985 include circuitry to provide PE and PMU test signals. By combining the PE and PMU functions on the same IC chips, the number of chips on each interface card is reduced and space on each card is conserved. This conserved space may be used, e.g., to implement additional functionality or to add more test channels to the interface cards. Furthermore, by sharing a common output stage between the PE and PMU circuitry on each IC chip, chip area previously used for redundant output stages and impedance-matching resistors is conserved. Tester 12 is connected to a device interface board 1005 for directing test signal to appropriate pins of the DUT. Additionally, tester 12 includes PMU control circuitry 1025, PE control circuitry 1045, and a computer interface 1065 for passing commands and data between tester 12 and a computer system (e.g., computer system 14).

Figure 8:
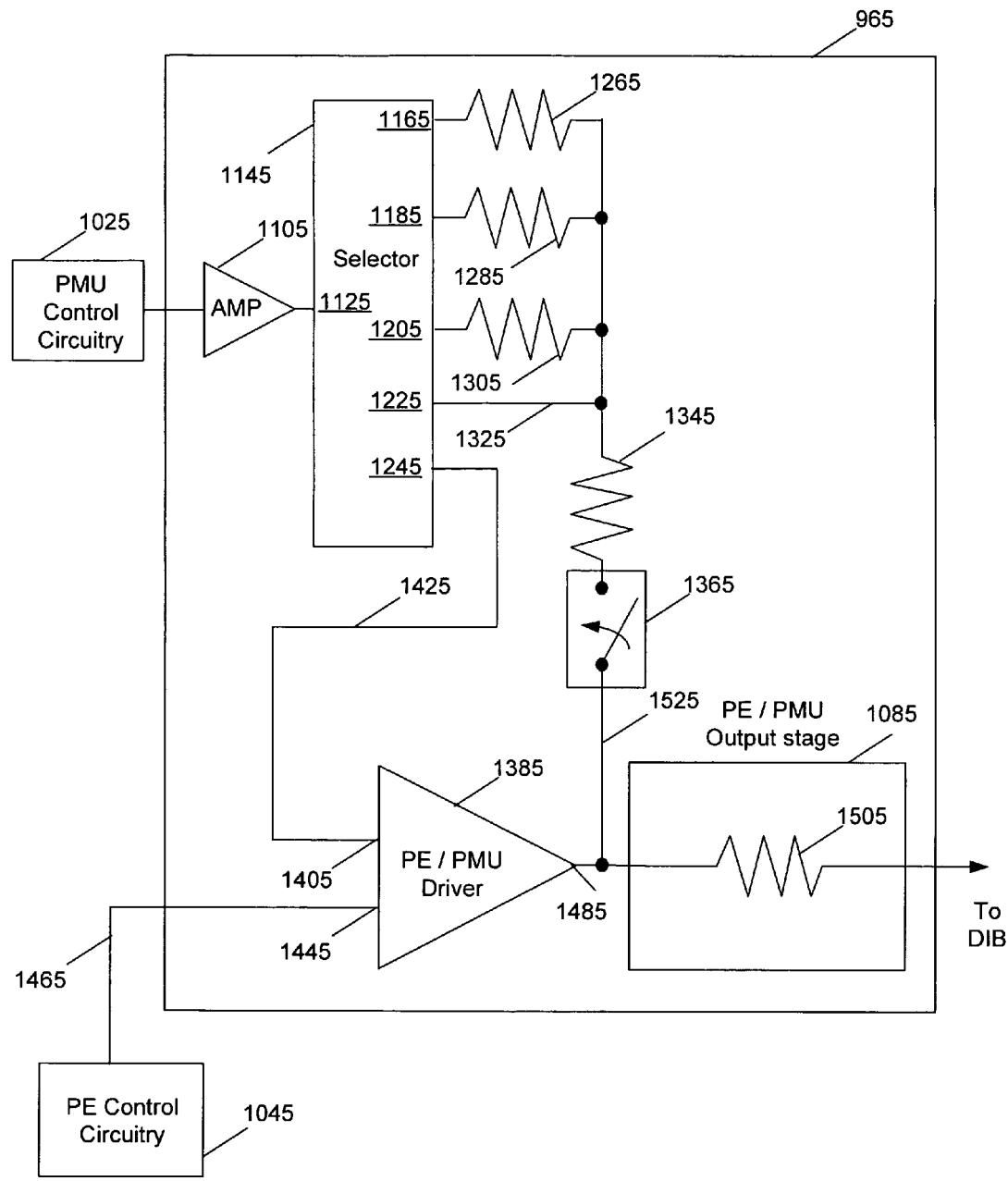
FIG. 8 is a diagrammatic view of PE and PMU circuitry that share a common output stage.

Referring also to FIG. 8, a portion of IC chip 965 is presented that includes circuitry for providing both PE and PMU test signals to a DUT. Additionally, IC chip 965 includes an output stage 1085 that is shared by both the PE and PMU circuitry. By sharing common output stage 1085, chip space is conserved on IC chip 965. Additionally, by implementing both functions in the same IC chip, board space is conserved on interface card 905.

PMU control circuitry 1025 sends a DC test signal through an amplifier 1105 to an input 1125 of a selector 1145 that directs the signal to a particular output port. In this example, selector 1125 includes five output ports 1165, 1185, 1205, 1225, and 1245. Each output port is used for providing a DC test signal with a particular current level (e.g., 50 milliamp, 2 milliamp, 200 microamp, 20 microamp, 2 microamp, etc.) to the DUT. Sense resistors 1265, 1285, and 1305 have different resistance values for sensing the particular DC test signal propagating from the corresponding output port. Output port 1225 is connected conducting trace 1325 (that does not include a sense resistor) for passing a DC test signal. In other arrangements, other types of resistors or resistor networks may be connected to the output ports 1165, 1185, 1205, 1225, and 1245 of selector 1145. For example a resistor may be inserted in series with conductor 1325.

Test signals from output ports 1165, 1185, 1205, and 1225 are passed through a resistor 1345 to a switch 1365 that controls passage of the test signals to shared output stage 108. Switch 1365 may be controlled by tester 12 or by commands sent from a computer system such as computer system 145. Typically when a PMU test is executed, switch 1365 is closed. However, when a PMU signal (e.g., 50 milliamp) is provided from output port 1245 switch 1365 is open. Additionally, for executing a PE test, switch 1365 is open. To control the position of switch 1365, tester 12 may produce a voltage or current signal to initiate placing switch 1365 into an open or closed position. Switch 1365 may be incorporated into IC chip 965 by various techniques known in the art of semiconductor device development and production. For example, one or more transistors or other types of semiconductor components may be incorporated into IC chip 965 to produce switch 1365.

To provide a relatively high-current PMU test signal, selector 1145 is also connected to a PE/PMU driver 1385 that amplifies the test signal. In particular output port 1245 is connected to an input 1405 of PE/PMU driver 1385 over conductor 1425. PE/PMU driver 1385 is shared by both the PMU and PE circuitry that is incorporated into IC chip 96. By sharing driver 1385, a PMU test signal may be amplified by the same driver used for PE test signals. For example, by amplifying a PMU test signal with driver 1385, large DC current signals (e.g., 50 milliamp) may be provided to the DUT for testing. By using the same driver to produce relatively large current PMU test signals along with PE test signals, a redundant driver is not needed and chip space is conserved on IC chip 965. Additionally by using the same driver 1385, power consumption is also conserved by reducing the power needs of a redundant driver.

PE control circuitry 1045 provides PE test signals into another input 1445 of PE/PMU driver 1385 via a conductor 1465. An output 1485 of PE/PMU driver 1385 sends the amplified PE test signal (or high current PMU test signal) to the shared output stage 1085. In this arrangement, output stage 1085 includes a resistor 1505 for impedance matching, however, two or more resistors may be included in output stage 1085. For example, resistor 1505 may have a resistance of 50 Ohm for matching a transmission line that connects to the DIB.

Since the output stage 1085 is shared by the PE and PMU circuitry, both PE and PMU test signals are passed through resistor 1505. For example, the higher current PMU test signals and PE test signals are sent from output 1485 of PE/PMU driver 1385 to resistor 1505. Similarly, the lower current PMU test signals are passed from switch 1365 (in a closed position) through a conductor 1525 to resistor 1505. These lower current PMU test signals are passed through the same resistor (resistor 1505) that passes the high current PE test signals and the high current PMU test signal (e.g., 50 milliamp). To account for the resistance of resistor 1505, the signal level of the lower current PMU test signals may be increased by amplifier 1105 or the PMU control circuitry 1025. Other techniques may also be implemented to account for the resistance of resistor 1505. For example the resistance of resistors 1265, 1285, 1305, and 1345 may be reduced (e.g., by 50 Ohm) to account for the resistance of resistor 1505. By sharing the use of output stage 1085, similar to sharing PE/PMU driver 1385, resistor 1505 is commonly used to provide PMU and PE test signals to the DUT, and space on IC chip 965 is conserved.

A number of implementations have been described. Nevertheless, it will be understood that various modifications may be made. Accordingly, other implementations are within the scope of the following claims.

The invention claimed is:

1. A semiconductor device tester comprising:
   a pin electronics (PE) stage configured to provide alternating current (AC) and direct current (DC) test signals to a semiconductor device under test, the DC test signals including a first current signal, wherein the PE stage is also configured to sense a response from the semiconductor device under test; and
   a parametric measurement unit (PMU) stage configured to provide DC test signals to the semiconductor device under test, the DC test signals including a second current signal, the first current signal containing a higher current level than the second current signal;
   wherein the PMU stage comprises a selector configured to provide test current from the PMU stage to the PE stage where the test current is used to generate the second current signal.

2. The semiconductor device tester of claim 1, wherein the sensed response includes a voltage that is present at the semiconductor device under test.

3. The semiconductor device tester of claim 1, wherein the PE stage includes at least one current source.

4. The semiconductor device tester of claim 1, wherein the PE stage is configured to produce a signal to represent the sensed response of the semiconductor device under test.

5. The semiconductor tester of claim 1, wherein the PE stage operates at a higher speed than the PMU stage.

6. A semiconductor tester comprising:
   a pin electronics (PE) stage configured to provide PE test signals to a semiconductor device under test, the PE test signals comprising alternating current (AC) and direct current (DC) test signals; and
   a parametric measurement unit (PMU) stage configured to provide PMU test signals to the semiconductor device under test, the PMU test signals comprising only DC test signals;
   wherein the PE stage operates at a higher speed than the PMU stage.

7. The semiconductor tester of claim 6, wherein the PE stage includes a diode for producing the DC test signals.

8. The semiconductor tester of claim 6, wherein the PE stage includes at least one current source for producing PE test signals that provide current.

9. The semiconductor tester of claim 6, wherein the PE stage further comprises:
   a comparator stage configured to receive a signal from the semiconductor device under test in response to a DC test signal output by the PE stage.

10. The semiconductor tester of claim 9, wherein the received signal is a voltage signal.

11. The semiconductor tester of claim 9, wherein the comparator stage includes an operational amplifier configured to compare the voltage signal to a first voltage.

12. The semiconductor tester of claim 9, wherein the comparator stage is configured to provide a signal that represents a comparison of the received signal and a first voltage.

13. A semiconductor tester comprising:
   a pin electronics (PE) current source configured to provide a first direct current (DC) current test signal to a semiconductor device under test;
   a PE comparator stage configured to receive a response voltage from the semiconductor device under test in response to the first DC current test signal, and to compare the response voltage to a first voltage and a second voltage for identifying the response voltage;
   a parametric measurement unit (PMU) driver circuit configured to provide a second DC test signal for testing the semiconductor device; and
   a feedback circuit comprising (i) a first sense line to sense a DC test signal at an output of the PMU driver circuit and to provide a resulting sensed DC test signal to an input of the PMU driver circuit to allow for the compensation of the second DC test signal, and (ii) second sense lines to sense for monitoring current across a resistor at an output of the PMU driver circuit.

14. The semiconductor tester of claim 13, wherein the first voltage is larger than the second voltage.

15. The semiconductor tester of claim 13, wherein the PE current source includes a high-impedance output.

16. The semiconductor tester of claim 13, wherein the PE comparator stage includes an amplifier for comparing the response voltage to the first voltage.

17. The semiconductor tester of claim 13, further comprising:
   a PE driver stage configured to provide a PE voltage test signal to the semiconductor device under test.

18. The semiconductor tester of claim 13, further comprising:
   PE circuitry configured to produce an alternating current (AC) test signal for testing the semiconductor device; and
   a driver circuit configured to provide, in a first mode, a version of the second DC test signal to the semiconductor device and, in a second mode, configured to provide a version of the AC test signal to the semiconductor device.

19. The semiconductor tester of claim 13, wherein PE circuitry operates at a higher speed than PMU circuitry.

* * * * *